United States Patent [19]

Creasman

[11] Patent Number: 4,513,942
[45] Date of Patent: Apr. 30, 1985

[54] PLATE MOLDING APPARATUS WITH INTERLOCKING CAVITY PLATES

[75] Inventor: Edwin A. Creasman, Fontana, Calif.

[73] Assignee: Bourns, Inc., Riverside, Calif.

[21] Appl. No.: 497,982

[22] Filed: May 25, 1983

[51] Int. Cl.³ .............................................. B22D 19/04
[52] U.S. Cl. ...................................... 249/95; 249/110;
264/272.14; 264/272.17; 264/276; 264/278;
425/121; 425/129 R; 425/572; 425/588
[58] Field of Search ...................... 264/272.11, 272.14,
264/272.17, 275, 276, 277, 278; 425/116, 121,
129 R, 572, 588; 249/95, 110

[56] References Cited

U.S. PATENT DOCUMENTS

| | | | |
|---|---|---|---|
| 2,596,993 | 5/1952 | Gookin | 18/36 |
| 2,672,653 | 3/1954 | Simpkins et al. | 18/42 |
| 3,539,675 | 11/1970 | Hugill | 264/157 |
| 3,650,648 | 3/1972 | Lambrecht | 425/129 |
| 3,779,506 | 12/1973 | Adams | 249/110 |
| 4,003,544 | 1/1977 | Bliven et al. | 249/95 |
| 4,044,984 | 8/1977 | Shimizu et al. | 249/95 |
| 4,126,292 | 11/1978 | Saeki et al. | 249/110 |
| 4,155,533 | 5/1979 | Lambrecht | 249/95 |
| 4,327,890 | 5/1982 | Cattano | 249/110 |
| 4,332,537 | 6/1982 | Slepcevic | 425/121 |
| 4,368,168 | 1/1983 | Slepcevic | 264/272.14 |
| 4,453,903 | 6/1984 | Dukaite | 425/129 R |

*Primary Examiner*—Jay H. Woo
*Assistant Examiner*—Timothy W. Heitbrink
*Attorney, Agent, or Firm*—Howard J. Klein; William G. Becker

[57] ABSTRACT

In an apparatus for encapsulating objects in molded plastic packages, an improved removable cavity plate assembly comprises upper and lower cavity plates which fit together in an interlocking manner to define molding cavities having integral surfaces formed within a single cavity plate on all sides of the cavity but one. The fourth side of each cavity is defined by a surface formed by the interlocking juncture between the two cavity plates. Plastic packages molded in the cavities thus are formed without a seam or parting line along the sides formed on the integral molding surfaces, the seam or parting line being formed only on the surface defined by the juncture of the two cavity plates.

20 Claims, 12 Drawing Figures

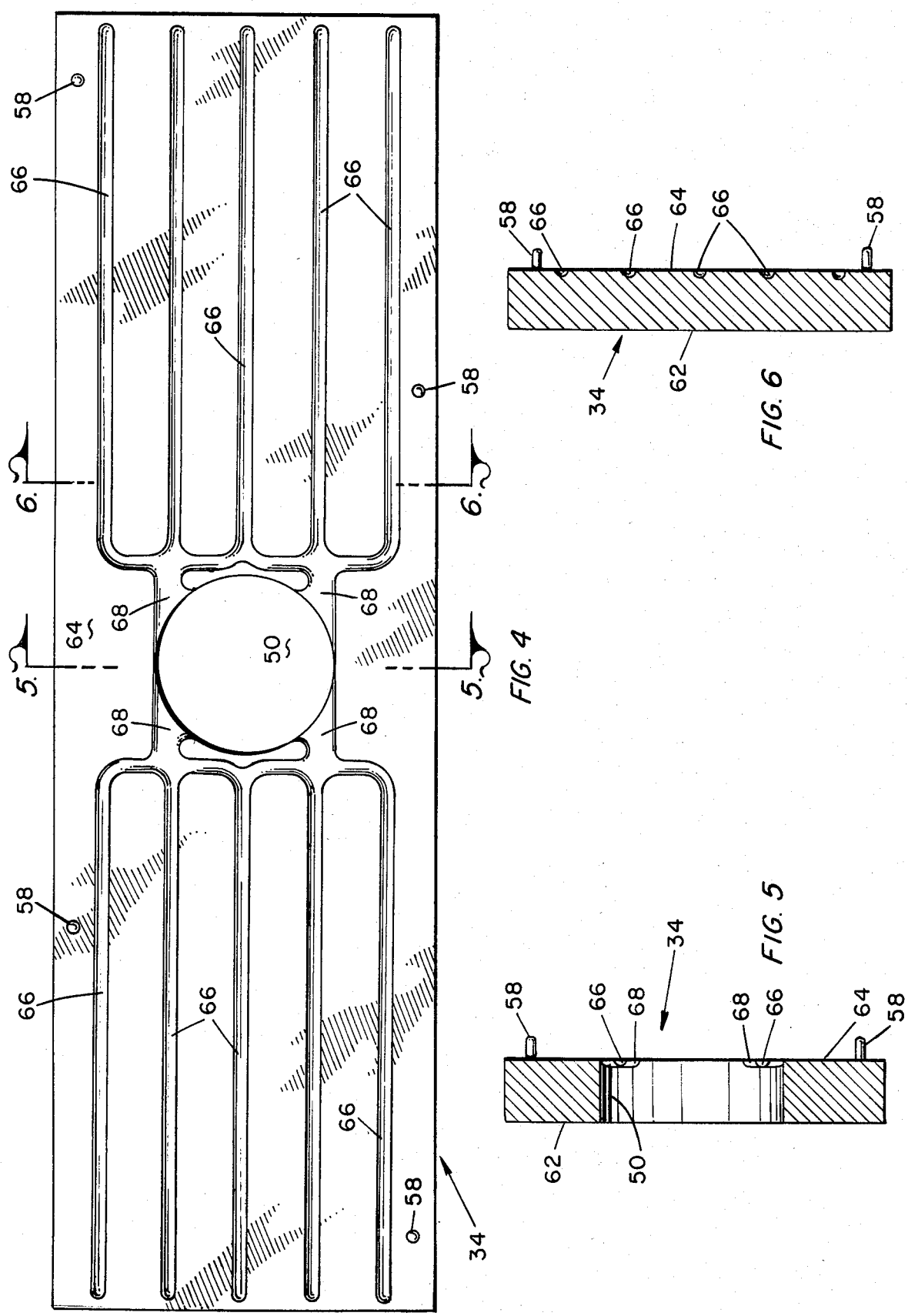

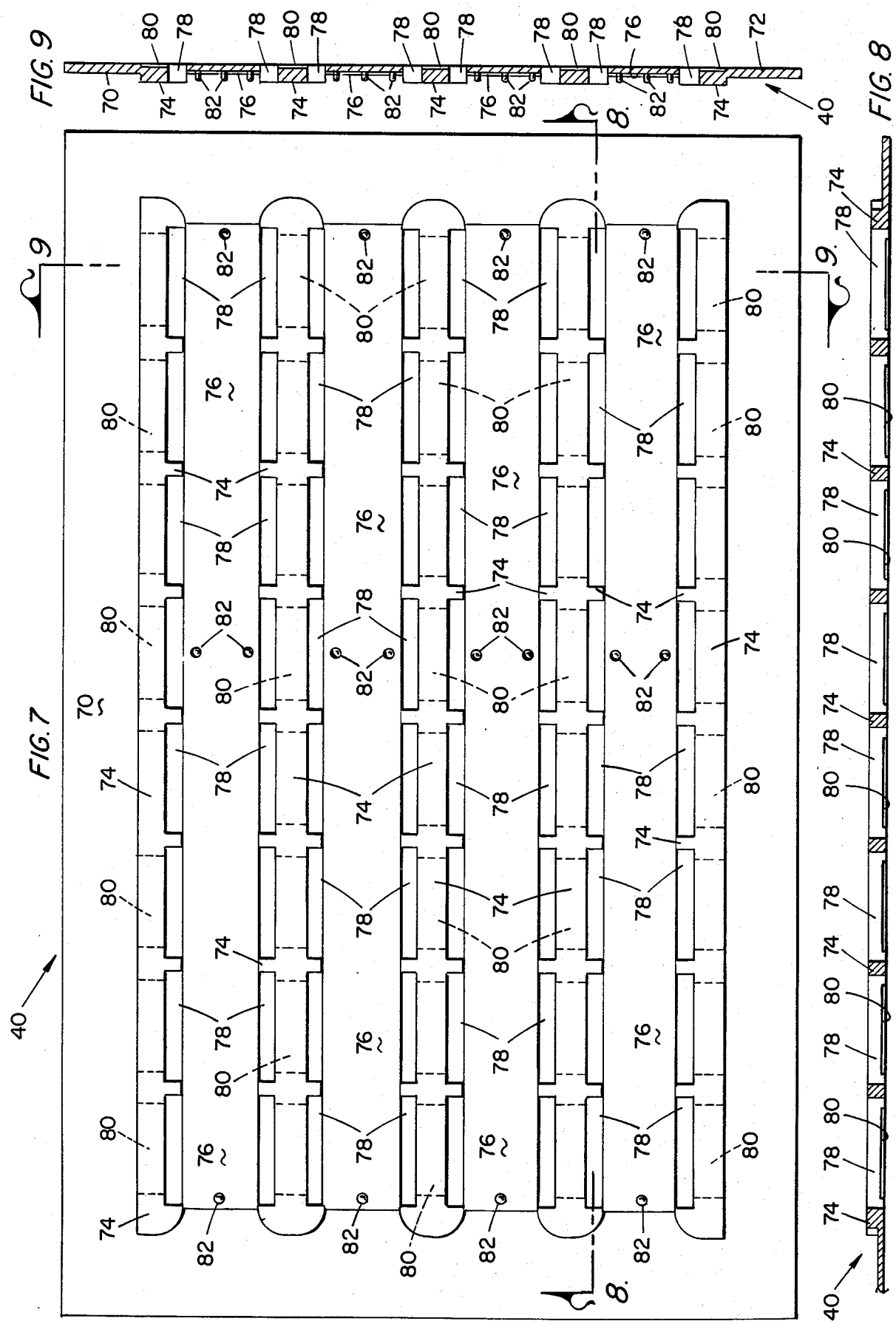

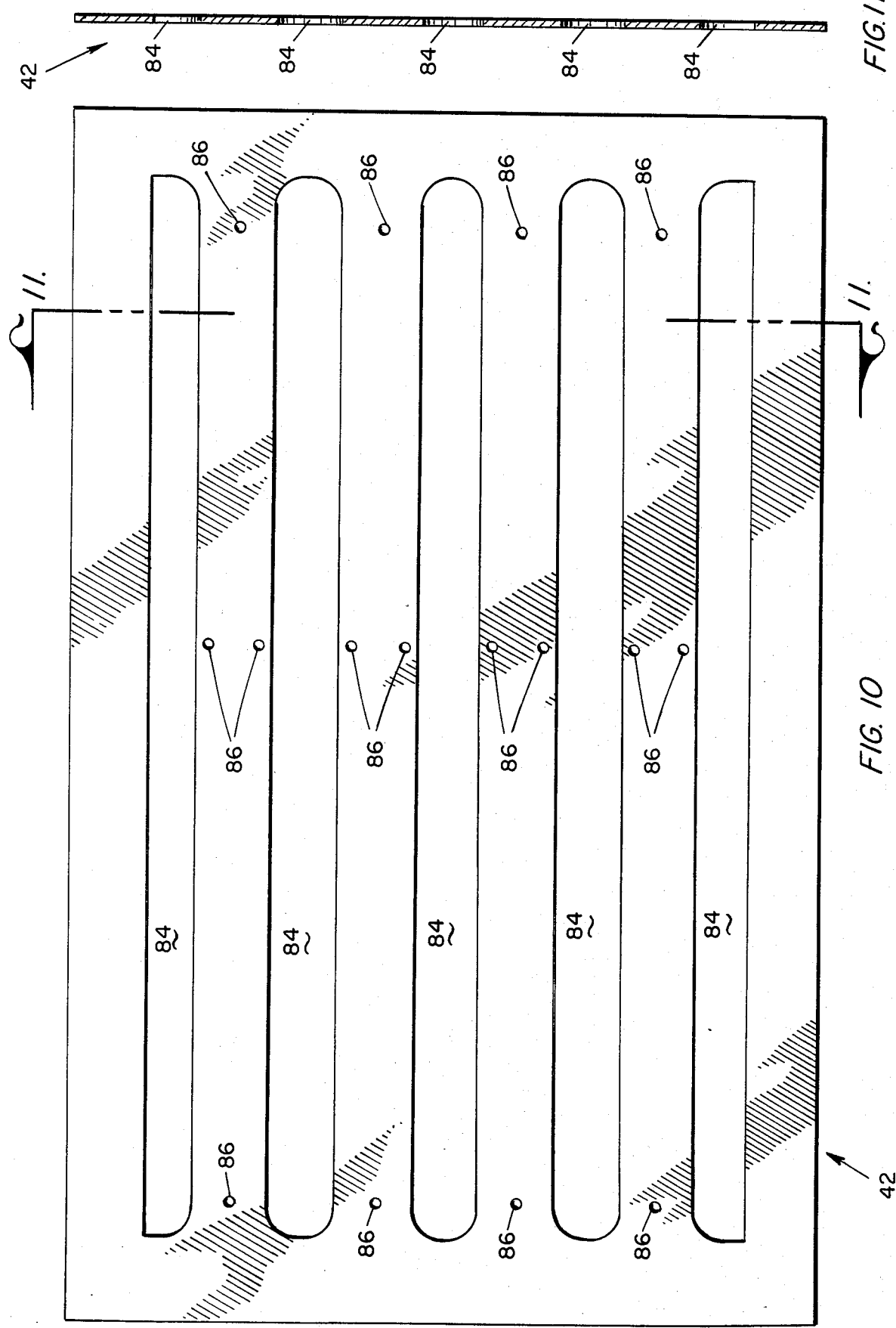

PLATE MOLDING APPARATUS WITH INTERLOCKING CAVITY PLATES

BACKGROUND OF THE INVENTION

This invention relates generally to the field of molding apparatus for the encapsulation of objects in a plastic material. Specifically, the invention relates to a plate molding apparatus, of the type employing removable cavity plates, and advantageously used for the encapsulation of electronic components and circuits.

In the manufacture of semiconductor devices, it is the typical practice to provide a lead frame having a centrally-located support pad to which is attached a semiconductor micro-circuit or component, usually termed a "chip". Electrical connections are made between selected leads and appropriate terminals on the chip, and the chip, with a portion of the leads, is encapsulated in a suitable plastic encapsulation material.

It has become the common practice to provide the lead frames in continuous strip form, with a plurality of individual lead frames attached to one another to form the lead frame strips. After the chips are installed, encapsulation is performed by placing the strips in a mold having a cavity surrounding each chip, and the encapsulating material is then forced into the cavities to encapsulate the chips. After removal from the mold, the lead frame strips are separated, or "singulated", into individual encapsulated devices.

The molding apparatus used in the encapsulation process typically comprises upper and lower mold plates having complementary arrays of cavities. The lead frame strips are positioned on the lower mold plate with the portions to be encapsulated in registration with the lower mold cavities. The upper mold plate is then lowered onto the lower mold plate, with the cavities of the two plates in registration. One of the mold plates has channels or "runners" through which the plastic encapsulation material is injected. The runners communicate with the cavities through small branches or "gates", and the plastic thus flows through the gates to fill the cavities. When the plastic has hardened, the mold plates are separated and the lead frame strips with their encapsulated portions are removed by means of ejection pins provided in one or both of the mold plates.

While effective encapsulation is provided by the conventional molding apparatus described above, several disadvantages exist. For example, a thorough cleaning of the cavities, runners, and gates is required after each batch of strips is encapsulated. This results in a considerable amount of down time. Also, the mold plates are quite expensive, as they must be precision machined to relatively close tolerances, and the complex configuration of runners, gates, and cavities adds to their cost, and makes cleaning difficult. Furthermore, the ejection pins add a degree of mechanical complexity which contributes to the cost, while the pins themselves often mar the surface of the plastic encapsulation.

These problems have been recognized in the prior art, and solutions have been sought. One approach which has met with success is disclosed in U.S. Pat. No. 4,332,537 and U.S. Pat. No. 4,368,168, both to Slepcevic. The Slepcevic patents disclose a method and apparatus for encapsulating electrical components in an encapsulation mold having removable cavity plate means disposed between upper and lower mold plates. The cavity plate means has openings therethrough in which are positioned the objects to be encapsulated. Liquid plastic is forced through runners in the surface of the upper mold plate and then into the cavity plate openings through gates.

The plastic hardens in the cavities, which are in the shape of the encapsulation packages. After hardening, the plastic is ejected from the runners of the upper mold plate, and the cavity plate means is removed. Finally, the packaged, encapsulated objects are removed from the cavity plate means.

One characteristic of the Slepcevic method and apparatus is the formation of a seam or "parting line" around the middle of the molded package. With many types of packages, the existence of a parting line is of no consequence. For example, in the encapsulation of electronic components in dual in-line packages, or "DIP's" (which have leads extending from two opposed sides of the package), the existence of a parting line creates no particular problem, and is, therefore, acceptable.

However, with some types of packages, the existence of a parting line is not acceptable. This is particularly the case with single in-line packages, or "SIP's" (which have leads extending from only one side). Due to particular characteristics of the equipment used in handling and marking SIP's, the existence of a parting line can interfere with the operation of such equipment.

Thus, while the Slepcevic method and apparatus have found acceptance in the manufacture of DIP's, their use for SIP's has been impeded by the formation of the parting line. As a result, manufacture of SIP's has continued under conventional encapsulation methods, such as the chase molding method, with the disadvantages recited above.

SUMMARY OF THE INVENTION

Broadly, the present invention is an improved cavity plate assembly for an encapsulation apparatus, of the type having removable cavity plate means removably positionable between upper and lower mold plates, wherein the cavity plate assembly provides a molded package without a parting line.

More specifically, a cavity plate assembly, in accordance with the present invention, comprises separate upper and lower cavity plates which fit together in a novel way to form seamless packages, and which are positionable, when so mated, between the upper and lower mold plates of the molding apparatus. Each of the cavity plates has an outer surface which fits flush against the molding surface of the adjacent mold plate, and an inner surface which mates, in interlocking fashion, with the inner surface of the other cavity plate.

Unlike the device disclosed in the aforementioned Slepcevic patents, only the upper cavity plate in the present invention has package-shaped cavities. The "cavities" of the lower cavity plate consist of one or more pairs of parallel elongate openings clear through it. The inner surface of the upper cavity plate has a plurality of parallel, elongate, flat-surfaced projections extending downwardly therefrom. These projections register with and extend through the elongate openings in the lower cavity plate, so that the flat surfaces of the projections are substantially flush against the molding surface of the lower mold plate. The thickness of the upper cavity plate through the projections is approximately equal to the thickness of the encapsulated packages, and the projections extend from the inner surface of the upper cavity plate a distance approximately equal to the thickness of the lower cavity plate.

The package-shaped cavities of the upper cavity plate are arranged in parallel rows along the sides of the projections, and the projections are located so that the sides of each projection are cut out to define three full sides of each cavity in a row. The remaining side of each cavity is defined by a surface formed by the mating of the upper and lower cavity plates. Since three full sides of the cavities are defined by the integral surfaces of a single cavity plate, three full sides of the packages formed in the cavities have surfaces which are uninterrupted by a parting line. A parting line is formed only on the side of the package formed on the surface created by the mating of the upper and lower cavity plates.

On the inner surface of the upper cavity plate, between each pair of adjacent projections, there is a recessed area, the edges of which form part (approximately one-half) of the fourth side of each cavity, that is, the side which is defined by the mating of the two cavity plates. The recessed area accommodates a lead frame strip on which the packaged objects (specifically electronic components) are carried. With this arrangement, the leads of the lead frame extend into the cavities from the recess on the cavity side defined by the mating of the two cavity plates. Thus, the package is formed with the parting line only on the side from which the leads extend, as is desired for SIP's.

As in the aforementioned Slepcevic patents, liquid plastic is injected into the cavity plates through runners in the molding surface of the upper mold plate, or "runner plate", and through gates formed in the outer surface of the upper cavity plate. However, in the present invention, the cavities in each row are arranged end-to-end (longitudinally) to form packages arranged longitudinally along each side of the lead frame strip. It is, therefore, advantageous to provide gate means into the cavities on the sides of the cavities opposite the lead frame strip recess. Thus, in the present invention, gates are formed by gating recesses in the outer surface of the upper cavity plate, opposite the flat inner surfaces of the cavity-defining projections on the inner surface thereof. The gating recesses are advantageously dimensioned and located to allow plastic to flow into each cavity along a substantial part of its length, thereby promoting more efficient plastic flow.

As will be more fully appreciated from the detailed description which follows, the present invention allows the packaging of SIP components in a manner which provides all of the advantages of the removable cavity plate molding method, in that the parting line on the side opposite the leads is eliminated. Thus, the manufacture of such packaged components is made less expensive and more convenient.

BRIEF DESCRIPTION OF THE DRAWINGS

FIG. 4 is a plan view of the upper mold plate, or runner plate, used in the present invention, showing the molding surface thereof;

FIG. 5 is a cross-sectional view along line 5—5 of FIG. 4;

FIG. 6 is a cross-sectional view along line 6—6 of FIG. 4;

FIG. 7 is a bottom plan view of an upper cavity plate in accordance with the present invention, showing the inner surface thereof;

FIG. 8 is a cross-sectional view along line 8—8 of FIG. 7;

FIG. 9 is a cross-sectional view along line 9—9 of FIG. 7.

FIG. 10 is a plan view of a lower cavity plate, in accordance with the present invention, both sides of said plate being substantially identical;

FIG. 11 is a cross-sectional view along line 11—11 of FIG. 10; and

DETAILED DESCRIPTION OF A PREFERRED EMBODIMENT OF THE INVENTION

As was previously discussed, the present invention is principally adapted to the manufacture of single in-line packages (SIP's) for electronic components, although other applications for the invention will surely suggest themselves to those skilled in the art. Nevertheless, the advantages of the present invention are best appreciated in conjunction with its use in the manufacture of SIP's. Therefore, a preferred embodiment of the invention is described in such a context.

Figures 1, 2:
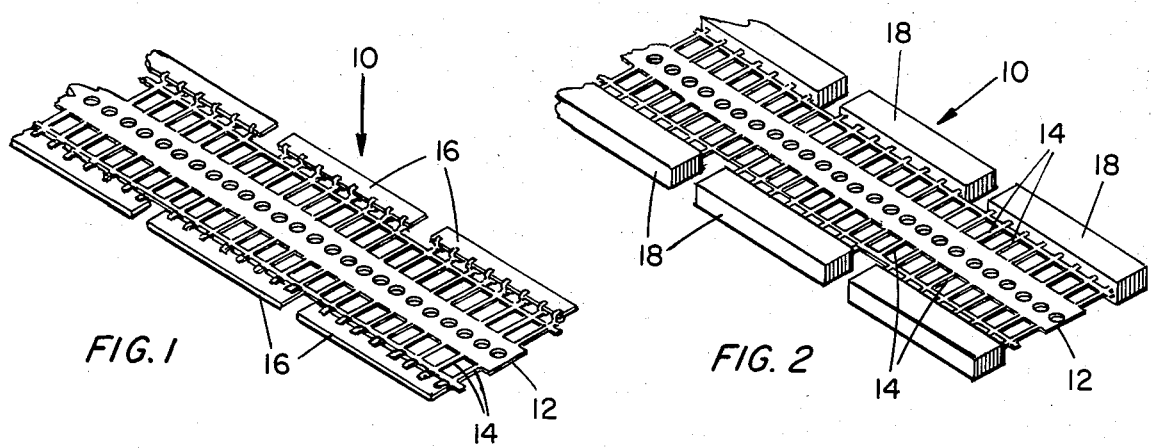
FIG. 1 is a perspective view of a lead frame strip having portions to be encapsulated.
FIG. 2 is a perspective view of the lead frame strip of FIG. 1 after the desired portions have been encapsulated.

FIGS. 1 and 2 illustrate a typical lead frame strip 10 of the type used for SIP components. FIG. 1 shows the strip 10 before encapsulation, and FIG. 2 shows it afterward. The strip 10 is formed by conventional means from a flat sheet of conductive material and comprises an apertured central band 12 from which extend a plurality of discrete leads 14. Arranged longitudinally on either side of the central band 12 are a plurality of substrates 16, each bearing an electronic device or circuit (not shown). The leads 14 are connected to terminals (not shown) on the substrates 16. After encapsulation, as shown in FIG. 2, the substrates 16 and adjacent portions of the leads 14 are encased in plastic packages 18, which are then separated from the central band 12 by conventional means. With the configuration shown in FIG. 2, the separate components will have leads extending from only one side of the package, as is the case with SIP's.

Figure 3:
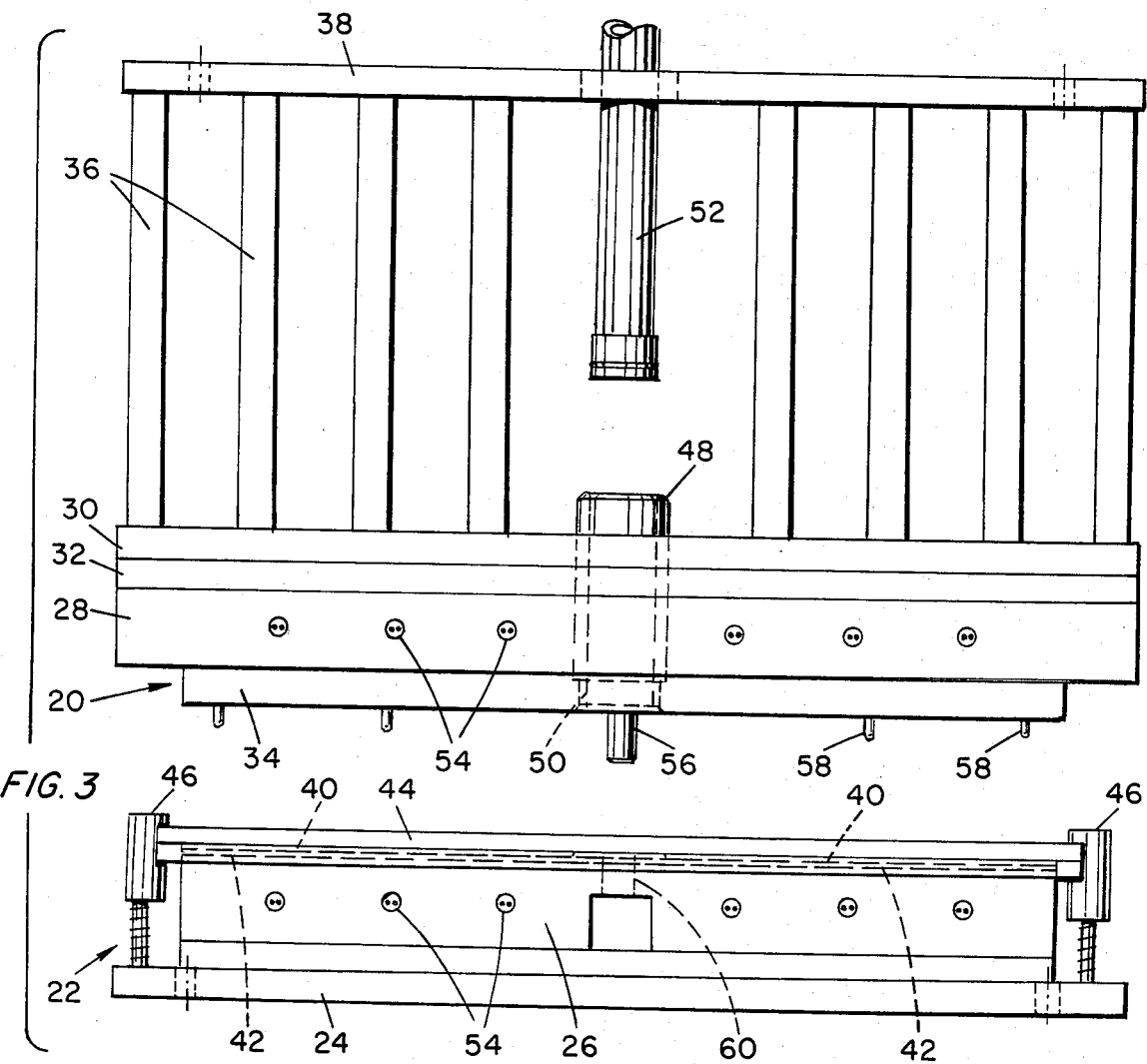
FIG. 3 is a sectional view, in elevation, of a molding apparatus in accordance with the present invention.

FIG. 3 shows a molding apparatus of the type with which the cavity plates of the present invention are used. This general type of molding apparatus is described in great detail in the aforementioned Slepcevic patents, and, therefore, only the major components will be described here in order to place the present invention in the proper context.

Briefly, the molding apparatus comprises an upper mold member 20 and a lower mold member 22. The lower mold member 22 includes a base 24 and a lower mold plate 26, the latter having a molding surface (not shown) which is smooth and planar. The upper mold member 20 includes a platen 28 mounted on a bridge plate 30 with a thermal insulation sheet 32 interposed therebetween. Mounted on the platen 28, in turn, is an upper mold plate or runner plate 34, which will be described in greater detail below.

The upper mold member 20 is mounted on the lower ends of a plurality of spacer bars 36 for vertical movement toward and away from the lower mold member 22, the movement being effected by conventional means, not shown. The upper ends of the bars 36 are fixed to a clamp plate 38.

Removably positioned between the runner plate 34 and the lower mold plate 26 is a cavity plate assembly, comprising a pair of upper cavity plates 40 and a pair of lower cavity plates 42, which will be described in detail below. The cavity plates 40, 42 are held in position by means of a frame assembly 44 carried in spring mounted brackets 46.

Centrally disposed in the upper mold assembly 20 is a receptacle or pot 48 for containing a supply of liquid plastic. The bottom of the pot 48 opens into a cylindrical chamber or cull 50 in the runner plate 34, from which the liquid plastic flows to the molding surface of the runner plate, as will be described below. A plunger 52 is reciprocally mounted through the clamp plate 38, and is capable of being pushed into the open top of the pot 48 to force the plastic into the cull 50 and onto the runner plate molding surface. The plunger 52 is moved into and out of the pot 48 by conventional means, not shown. To maintain the plastic in a fluid state, heating elements 54 are disposed throughout the platen 28 and the lower mold plate 26.

Finally, to assure that proper alignment between the various assemblies is maintained, the upper mold member 20 is provided with leader pins 56 and locator pins 58, the former fitting into registering bushings 60 in the lower mold member 22, and the latter fitting through holes (not shown) in the cavity plate assembly and into sockets (not shown) in the lower mold plate 26.

FIGS. 4, 5, and 6 illustrate in detail the runner plate 34 used in the apparatus of FIG. 3 in conjunction with the present invention. The runner plate 34 is preferably rectangular in shape, with a substantially uninterrupted, planar outer surface 62 (FIG. 6), and an inner or molding surface 64 having a plurality of channels or "runners" 66 formed therein. The runners 66 are arranged in two longitudinal arrays extending from opposite sides of the bottom opening of the cull 50. As previously mentioned, the cull 50 is a cylindrical chamber centrally located in the runner plate 34, and it communicates with the runners 66 through a plurality of suitably arranged feeder channels 68. The cull 50, feeder channels 68, and runners 66 thus provide a passage for the flow of liquid plastic from the pot 48 (FIG. 3) to the molding surface 64 of the runner plate 34.

FIGS. 7, 8, and 9 illustrate in detail one of the novel upper cavity plates 40 used in the present invention. Two such upper cavity plates 40 are installed in the frame assembly 44 (along with two lower cavity plates 42), with one upper cavity plate 40 positioned under each side of the runner plate 34, as best shown in FIG. 3. This arrangement is preferred, as it provides increased capacity and flexibility as compared with the use of single upper and lower cavity plates, for which the apparatus can easily be modified. Because the cavity plates on either side of the apparatus are virtually identical, only one of each of the top and bottom plates is illustrated in the drawings and described herein.

The upper cavity plate 40 is a relatively thin, but rigid, sheet of metal, preferably rectangular in shape, having a first, or inner, surface 70 and a second, or outer, surface 72, as best shown in FIG. 9. The inner surface 70 has a plurality of generally parallel, elongate raised areas or projections 74. These projections 74 are flat-surfaced and they are preferably arranged longitudinally, that is, parallel with the longer dimension of the plate. Between each pair of adjacent projections 74 is a shallow, rectangular recess 76 extending almost the full length of the projections 74. The recesses 76 extend the full width between adjacent projections 74. Arranged longitudinally along both sides of each recess 76 are a plurality of rectangular apertures or cavities 78, which are located such that three sides of each cavity 78 are formed within a projection 74, and the fourth side of each cavity is coincident with the edge of an adjacent recess 76, as best shown in FIG. 7.

The thickness of the plate through each of the projections 74 is approximately equal to the thickness of the packages to be formed within the cavities 78, while the thickness of the plate in the area of the recesses 76 is approximately half, or slightly less than half, the thickness of a finished package. Thus, three full sides of each cavity are defined by the cut-out portions of the projections 74, and approximately one-half of the fourth side is defined by the edge of the adjacent recess 76.

The outer surface 72 of the upper cavity plate 40 is generally flat, except for shallow, oblong depressions 80 formed in the surface opposite the projections 74, alongside each cavity 78. As will be described more fully below, the depressions 80 function as gates for the passage of liquid plastic into the cavities 78 from the runners 66. Although the depressions or gates 80 are relatively shallow, they extend along a substantial portion of the length of each cavity, with widths approximately the same as the widths of the runners 66. Thus, an even and efficient flow of plastic from the runners 66 into the cavities 78 is allowed.

As will be discussed below, the recesses 76 accommodate the lead frame strips 10. To assure correct placement of the strips, and to restrain them from movement, locator pins 82 are provided at suitable locations in the recesses 76.

Referring now to FIGS. 10 and 11, the novel lower cavity plate 42 used in the present invention is shown. The lower cavity plate 42 is a flat, relatively thin, but rigid, sheet of metal, with approximately the same dimensions as the upper cavity plate 40. Both surfaces of the lower cavity plate 42 are virtually identical, and are, therefore, essentially interchangeable as the inner and outer surfaces. The lower cavity plate 42 is characterized chiefly by a plurality of parallel, elongate openings or slots 84, located and dimensioned so as to register with and receive the projections 74 of the upper cavity plate 40. The lower cavity plate 42 also has a plurality of small holes 86 located and dimensioned to receive the locator pins of the upper cavity plate 40. The upper and lower cavity plates fit together in mating fashion, with the projections 74 being received in the slots 84, the locator pins 82 fitting into the holes 86, and the inner surfaces of the two plates fitting flush against one another. The thickness of the lower cavity plate 42 is such that when the two cavity plates are so mated, the flat bottom surfaces of the projections 74 are substantially flush with the lower or outer surface of the lower cavity plate 42. Thus, when the two cavity plates are fitted together, the flat surfaces of the projections 74 are engageable with the molding surface of the lower mold plate 26 around three sides of each of the cavities 78.

Figure 12:
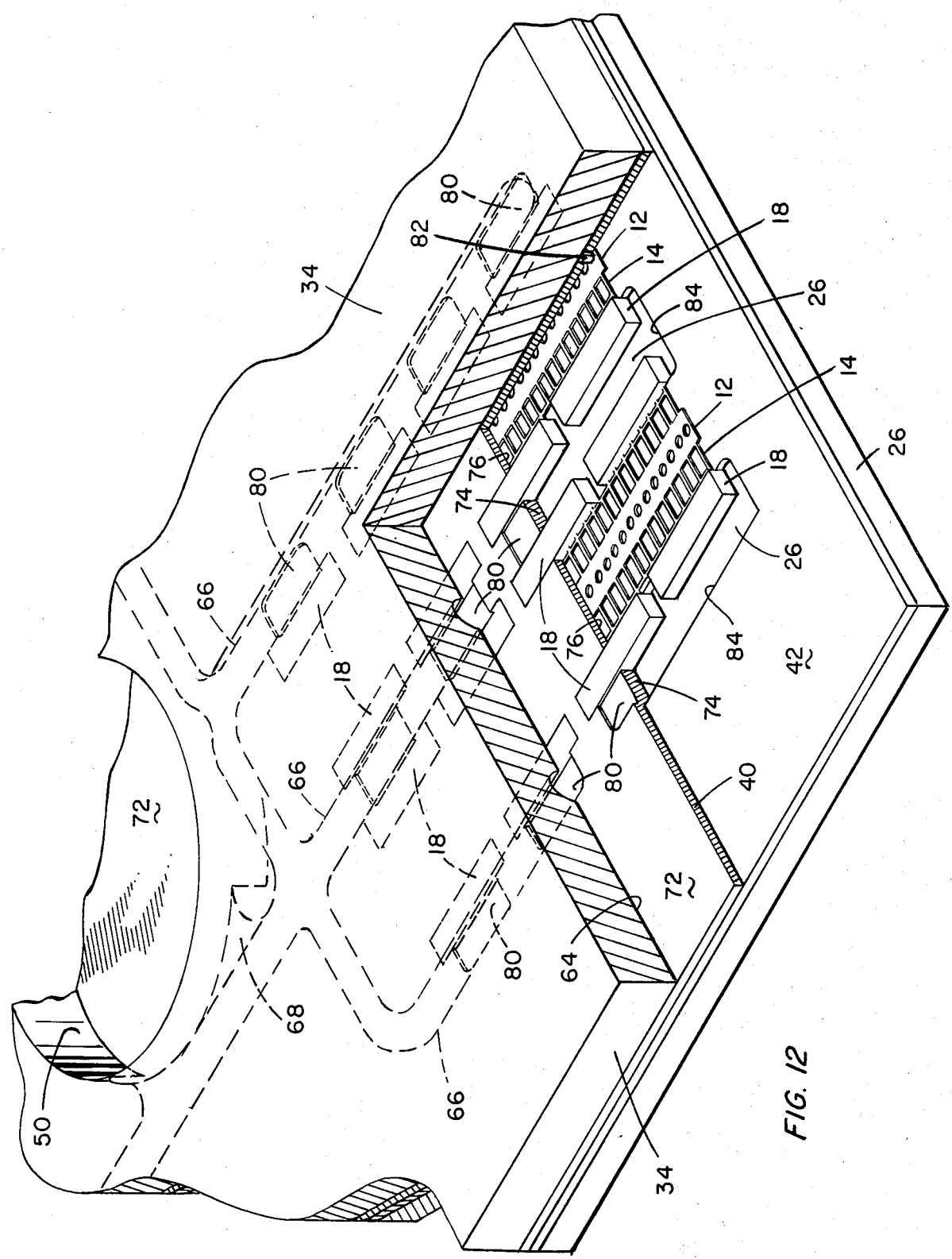
FIG. 12 is a perspective view, partially broken away, of the mold plates and cavity plates of the present invention.

As best shown in FIG. 12, the solid portions of the lower cavity plate 42 between the slots 84 are aligned with and slightly spaced from the recesses 76 between the projections 74 of the upper cavity plate 40. The longitudinal edges of the slots 84 thus coincide with the edges of the recesses 76 which form the fourth side of each cavity 78, as described above. Thus, the juncture between the two cavity plates at the coincident edges of the slots 84 and recesses 76 fully forms the fourth side of each cavity 78. In other words, at this juncture, the upper portion (approximately one-half) of the fourth cavity side is formed by the edges of the recesses 76, and the lower portion is formed by the edges of the slots 84. The cavities 78 are thus formed on three sides solely within the projections 74, while the fourth side is formed by the juncture of the upper and lower cavity plates.

The manner of operation of the invention is best understood with reference to FIG. 12, which shows how the interlocking fit of the upper and lower cavity plates forms "seamless" packages 18, or, more properly expressed, packages with a parting line only on the side from which the leads 14 extend.

As a first step, the unencapsulated lead frames 10 (FIG. 1) are positioned in the recesses 76 of the upper cavity plate 40. The lead frames are held in position by means of the locator pins 82, some of which register with holes in the central band 12 of the strip, with the remaining pins seating between adjacent leads 14. The lower cavity plate 42 is then positioned onto the upper cavity plate 40 in the interlocking manner described above. The substrates 16 to be encapsulated are, at this point, disposed within the cavities 78, with the leads 14 disposed in the recesses 76.

The assembled cavity plates 40, 42 are then installed in the frame assembly 44 (FIG. 3) and positioned between the lower mold plate 26 and the runner plate 34, with the outer, or lower, surface of the lower cavity plate 42 seated against the flat molding surface of the lower mold plate 26, and the outer, or upper, surface 72 of the upper cavity plate 40 seated against the channelled inner surface 64 of the runner plate 34. The substrates 16 are thus fixed in position relative to, and apart from, the runner plate and lower mold plate.

When the cavity plate assembly is secured between the runner plate 34 and the lower mold plate 26, the gates 80 formed in the upper surface of the upper cavity plate 40 are in communication with the runners 66 in the runner plate. The encapsulation process is now ready to begin.

Liquid plastic from the pot 48 (FIG. 3) is injected into the cull 50 by the plunger 52. From the cull 50, the plastic is distributed into the runners 66 via the feeder channels 68. The plastic then flows through the gates 80 and into the cavities 78. When the plastic has hardened, the cavity plate assembly is removed from between the runner plate and the lower mold plate, the two cavity plates are separated, and the lead frames with the encapsulated components are removed for singulation and further processing, such as marking.

As can be seen in FIG. 12, all sides of each package 18, except the side from which the leads 14 extend, are formed by integral surfaces of a single cavity plate, i.e., the upper cavity plate 40. Thus, these three sides will be uninterrupted by any seam or parting line, such as would be produced by a molding surface formed by the juncture of two cavity plates. The only molding surface in the cavities 78 which is formed by the juncture of the upper and lower cavity plates is that which is adjacent the recesses 76, in which the lead frames are positioned. Thus, a "seam" is formed only on the side of each package from which the leads extend, where the presence of such a seam is of no consequence. As previously mentioned, this is the desired result for SIP components.

It will thus be appreciated that the present invention provides an efficient means for encapsulating objects, such as electronic components, in single in-line packages (SIP's). It will be further appreciated that this result is achieved with all the advantages previously realized in the manufacture of other types of encapsulated packages (such as DIP's) with plate molding devices having removable cavity plates.

While the preferred embodiment of the invention has been described, various modifications will suggest themselves to those skilled in the pertinent arts. Thus, for example, encapsulation packages of various shapes and sizes can be provided by varying the shape, size, and configuration of the cavities and slots of the upper and lower cavity plates, respectively. Other runner and gate configurations can be used, as desired, where advantageous in particular applications. These and other modifications and variations should be considered within the scope of the present invention.

What is claimed is:

1. An improved cavity plate assembly for an apparatus for encapsulating lead frame-mounted objects in molded packages of the type having first and second opposed mold plates with first and second molding surfaces, respectively; cavity plate means removably positionable between said first and second mold plates and having an array of multi-sided cavities in which said objects are held in a fixed position relative to and apart from said molding surfaces; passage means in said first mold plate for allowing the passage of liquid encapsulation material to said first molding surface; and channel means, in said first molding surface and in said cavity plate means, for communicating between said passage means and each of said cavities, whereby said liquid encapsulation material can be injected into said cavities via said passage means and said channel means, wherein the improvement comprises:

a first cavity plate having first and second opposed surfaces, said first surface being positionable against said first molding surface;

a plurality of elongate, flat-surfaced projections extending from said second surface of said first cavity plate;

means within said projections defining said array of cavities, all but one side of each of said cavities being defined by integral surfaces within one of said projections; and a second cavity plate having a plurality of elongate slots therethrough, said slots located and dimensioned to register with and receive said projections;

whereby the remaining side of each of said cavities is defined by a mating surface formed by the juncture of said first and second cavity plates at the edge of one of said slots when said first and second cavity plates are fitted together with said projections received in said slots.

2. The improved cavity plate assembly of claim 1, wherein said projections are arranged substantially parallel to one another, and an elongate recess dimensioned to accommodate a lead frame is disposed between adjacent ones of said projections.

3. The improved cavity plate assembly of claim 1, wherein said second cavity plate has an outer surface positionable against said second molding surface, and said flat surfaces of said projections are substantially flush with said outer surface when said first and second cavity plates are fitted together with said projections received in said slots.

4. The improved cavity plate assembly of claim 2, wherein the thickness of said first cavity plate through each of said projections is approximately equal to the thickness of the packages to be formed in the cavities defined by said cavity-defining means in each of said projections, and the thickness of said first cavity plate through each of said recesses is approximately one half of the thickness of the packages to be formed in the cavities defined by said cavity-defining means in the projections adjacent to each of said recesses.

5. The improved cavity plate assembly of claim 2, wherein said cavities are rectangular, and wherein said cavity-defining means comprises a plurality of rectangular apertures through said first cavity plate and arranged longitudinally along each of said projections such that three sides of each of said apertures are formed within one of said projections.

6. The improved cavity plate assembly of claim 5, wherein each of said recesses has an edge adjacent to one of said projections, said edge being coincident with the fourth side of each of said apertures formed in said adjacent projection.

7. The improved cavity plate assembly of claim 6, wherein each of said slots has an edge located so as to be coincident with the edge of one of said recesses when said projections are received in said slots, and wherein each of said cavities has three sides formed entirely within one of said projections and a fourth side formed by the juncture of an edge of one of said slots and an edge of one of said recesses.

8. The improved cavity plate assembly of claim 1, wherein said channel means comprises:
an array of runners formed in said first molding surface and communicating with said passage means; and
gating means, formed in said first surface of said first cavity plate, for conducting said encapsulation material from said runners into each of said cavities.

9. The improved cavity plate assembly of claim 8, wherein said gating means comprises a plurality of discrete recesses in said first surface of said first cavity plate opposite said flat surface of each of said projections, each of said discrete recesses extending along at least a substantial portion of the length of each of said cavities.

10. An improved cavity plate assembly for an apparatus for encapsulating lead frame-mounted objects in molded packages, of the type having first and second opposed mold plates having first and second molding surfaces, respectively; cavity plate means removably positionable between said first and second mold plates and having an array of multi-sided cavities in which said objects are held in a fixed position relative to and apart from said molding surfaces; passage means in said first mold plate for allowing the passage of liquid encapsulation material to said first molding surface; and channel means, in said first molding surface and in said cavity plate means, for communicating between said passage means and each of said cavities, whereby said liquid encapsulation material can be injected into said cavities via said passage means and said channel means, wherein the improvement comprises:
a first cavity plate having an outer surface positionable against said first molding surface and an inner surface opposed to said outer surface;
a pair of generally parallel rows of generally package-shaped apertures in said first cavity plate;
a recess in said inner surface of said first cavity plate between said row of apertures, said recess dimensioned to accommodate a lead frame and having an edge coincident with one side of the apertures in each of said rows; and
a second cavity plate having an outer surface positionable against said second molding surface and an inner surface opposed to said outer surface, and including a pair of elongate, generally parallel slots therethrough defining an elongate flat surface therebetween, each of said slots having a longitudinal edge;
whereby, when said first and second cavity plates are positioned with their respective inner surfaces in co-engagement, and their respective outer surfaces in engagement with said first and second molding surfaces, each of said slots is in registration with one of said rows of cavities, a portion of said inner surface of said first cavity plate engages said second molding surface through said slots around all but one side of each of said apertures, each of said edges of said recess coincides with an edge of one of said slots, and said recess is aligned with and spaced from said elongate flat surface between said slots.

11. The improved cavity plate assembly of claim 10, wherein each of said apertures is rectangular, and wherein said first cavity plate includes a pair of substantially parallel, elongate projections extending from said inner surface, each of said projections terminating in a planar surface, said projections being located so as to register with and be received in said slots when said first and second cavity plates are positioned with their respective inner surfaces in co-engagement, said projections each having cut-out portions defining three sides of each of said apertures in one of said rows.

12. The improved cavity plate assembly of claim 11, wherein the remaining side of each of said apertures is defined by an edge of one of said recesses.

13. The improved cavity plate assembly of claim 10, wherein said channel means includes gating means, formed in said outer surface of said first cavity plate, for conducting said encapsulation material from said first molding surface into each of said apertures.

14. The improved cavity plate assembly of claim 13, wherein said gating means comprises a row of discrete recesses in said outer surface of said first cavity plate opposite said planar surface of each of said projections and adjacent each of said apertures.

15. The improved cavity plate assembly of claim 14, wherein each of said discrete recesses extends along a substantial portion of the length of the adjacent aperture.

16. The improved cavity plate assembly of claim 11, wherein said planar surfaces of said projections are substantially flush with said outer cavity plate when said first and second cavity plates are positioned with their respective inner surfaces in co-engagement.

17. A cavity plate assembly to be used in an encapsulation apparatus using a pair of mold plates, wherein electronic components having attached electrical leads are encapsulated in plastic, the cavity plate assembly comprising:
an upper cavity plate having a substantially flat outer surface adapted for engagement with one of said mold plates, and an inner surface which includes a plurality of projections extending from said inner surface a predetermined substantially equal distance;

a plurality of openings throughout the body of the upper cavity plate disposed adjacent to said projections, a plurality of recesses formed in said inner surface of said upper cavity plate and disposed adjacent to said openings, said projections, openings, and recesses being jointly configured such that each aperture forms a substantially rectangular aperture, three sides of which are formed entirely within one of said projections, and one side of which is formed by the body of the upper cavity plate disposed along one recess, whereby one side of each aperture in said upper cavity plate has substantially lesser wall thickness than the three other sides; and a substantially flat lower cavity plate having a plurality of openings through its body, said lower cavity plate jointly with the openings therein being configured to be superimposable with one of its surfaces on said inner surface of said upper cavity plate, said lower cavity plate jointly with its openings being further configured to register an edge of its openings with the one side of each aperture disposed along said recesses of said upper cavity plate and to accommodate said projections of said upper cavity plate, whereby, in the assembled upper and lower cavity plates, cavities are formed which are substantially exactly coextensive with the apertures in the upper cavity plates and whereby only the one side of each cavity is jointly formed by the assembled upper and lower cavity plates.

18. The cavity plate assembly of claim 17, further comprising alignment means for aligning said upper and lower cavity plates when said lower cavity plate is superimposed on said upper cavity plate so that said projections register with and are received in said openings in said lower cavity plate.

19. The cavity plate assembly of claim 18, wherein said alignment means comprises:

a plurality of pins disposed on one of said cavity plates; and a plurality of registering apertures on the other of said cavity plates.

20. The cavity plate assembly of claim 17, wherein said projections are elongate and substantially parallel to one another, and terminate in a substantially flat surface, said openings in said lower cavity plate are elongate, generally parallel slots dimensioned to accommodate said projections, and said predetermined distance of extension of said projections is approximately equal to the thickness of said lower cavity plate.

* * * * *